(12) United States Patent
Pan

(10) Patent No.: US 10,108,043 B2
(45) Date of Patent: Oct. 23, 2018

(54) COLOR FILTER SUBSTRATE AND DISPLAY DEVICE

(71) Applicant: Wuhan China Star Optoelectronics Technology Co., Ltd., Wuhan (CN)

(72) Inventor: Biao Pan, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 233 days.

(21) Appl. No.: 15/122,419

(22) PCT Filed: Jul. 20, 2016

(86) PCT No.: PCT/CN2016/090580
§ 371 (c)(1),
(2) Date: Aug. 30, 2016

(87) PCT Pub. No.: WO2018/000475
PCT Pub. Date: Jan. 4, 2018

(65) Prior Publication Data
US 2018/0203289 A1    Jul. 19, 2018

(30) Foreign Application Priority Data

Jun. 29, 2016  (CN) .......................... 2016 1 0499421

(51) Int. Cl.
*G02B 5/20*     (2006.01)
*G02F 1/1335*   (2006.01)
(Continued)

(52) U.S. Cl.
CPC ......... *G02F 1/133514* (2013.01); *G02B 5/20* (2013.01); *G02B 5/201* (2013.01);
(Continued)

(58) Field of Classification Search
CPC .... G03F 7/0007; G03F 7/0002; G03F 7/0015; G02B 5/201; G02B 5/223; G02F 1/133516; B82Y 20/00
(Continued)

(56) References Cited

U.S. PATENT DOCUMENTS

2005/0206310 A1* 9/2005 Bertram .............. H01L 51/5036
313/506

FOREIGN PATENT DOCUMENTS

CN         102135634 A  * 7/2011

OTHER PUBLICATIONS

Computer-generated translation of CN 102135634 (Jul. 2011) (Year: 2011).*

* cited by examiner

*Primary Examiner* — John A McPherson
(74) *Attorney, Agent, or Firm* — Leong C. Lei

(57) ABSTRACT

The present invention provides a color filter substrate and a display device. The color filter substrate of the present invention includes a backing plate, a black matrix arranged on the backing plate, and a plurality of color resist blocks arranged on the backing plate and spaced from each other by the black matrix. The color resist blocks include a multiple-pore support layer and a color resist material distributed in the multiple-pore support layer. The color resist material includes pigment molecules. The multiple-pore support layer includes a plurality of pores formed therein such that the pores have a size that is greater than a size of the pigment molecules so as to provide effective dispersion and support of pigment molecules, allowing for reducing the amount of non-pigment constituents, such as a dispersion agent and resin, of the color resist material and increasing the content of pigment constituent to thereby improve the performance of light filtration for each unit film thickness of the color (Continued)

resist blocks and allow for thinning of the color filter substrate and an increased density of pixels. The display device of the present invention includes the above-described color filter substrate and shows various advantages, including wide gamut, reduced thickness, and increased brightness.

6 Claims, 6 Drawing Sheets

(51) Int. Cl.
    *G03F 7/00*     (2006.01)
    *G02B 5/22*     (2006.01)
    *B82Y 20/00*     (2011.01)

(52) U.S. Cl.
    CPC ........... *G02B 5/223* (2013.01); *G02F 1/1335* (2013.01); *G02F 1/133512* (2013.01); *G03F 7/0007* (2013.01); *B82Y 20/00* (2013.01)

(58) Field of Classification Search
    USPC .............................................. 430/7; 349/106
    See application file for complete search history.

COLOR FILTER SUBSTRATE AND DISPLAY DEVICE

BACKGROUND OF THE INVENTION

1. Field of the Invention

The present invention relates to the field of display technology, and in particular to a color filter (CF) substrate and a display device.

2. The Related Arts

With the development of the display technology, flat panel display devices, such as liquid crystal displays (LCDs), due to a variety of advantages, such as high image quality, low power consumption, thin device body, and a wide range of applications, have been widely used in various consumer electronic products, such as mobile phones, televisions, personal digital assistants (PDAs), digital cameras, notebook computers, and desktop computers and are thus a main stream of display devices.

Most of the LCDs that are currently available in the market are backlighting LCDs, which comprise a liquid crystal display panel and a backlight module. The working principle of the liquid crystal display panel is that liquid crystal molecules are arranged between two parallel glass substrates and a plurality of vertical and horizontal tiny wires are arranged between the two glass substrates so that through application of electricity, the liquid crystal molecules are controlled to change direction in order to refract out light emitting from the backlight module to generate an image.

Generally, a liquid crystal display panel is composed of a color filter (CF) substrate, a thin-film transistor (TFT) substrate, liquid crystal (LC) interposed between the CF substrate and the TFT substrate, and sealant.

The color filter substrate, which is composed of color filters of three colors, including red (R), green (G), and blue (B), is an important part of a TFT LCD. As shown in FIG. 1, a conventional CF substrate is generally composed of a backing plate 100, a color filter 200 and a black matrix 300 arranged on the backing plate 100, and a plurality of spacers 400 arranged on the black matrix 300, wherein the color filter 200 comprises a plurality of red resist blocks 210, a plurality of green resist blocks 220, and a plurality of blue resist blocks 230 that are divided by the black matrix 300. The displaying characteristics of the TFT LCD require the color filter 200 to show properties and performances of high transmission rate and high color purity, large image, full color, high contrast, low reflection rate, high flatness, and good resistance.

Heretofore, methods that are adopted manufacture color resist blocks include pigment dispersion method, dying method, retro-printing method, thermal multilayer technology, and inkjet printing method. Due to various advantages in respect of color property, quality, and operability, the pigment dispersion method has been widely used and is the main stream manufacturing process. The operations of the pigment dispersion method are different for different mode of displaying.

However, in making color resist blocks using pigment dispersion, in addition to pigments that provide an effect of light filtration, additives, such as dispersion agents and rein must be added to the color resist material to facilitate impregnation and dispersion of the pigment. Due to the inclusion of the dispersion agent, the percentage of the pigment in the color resist material would be decreased, but the dispersion agent provide no contribution to light filtration so that the thickness of the color filter must be increased in order to obtain sufficiently high color purity. Increasing the color filter thickness, in addition to an increase of the cost, would also lower down light transmission rate of the entire display device, thereby leading to an increase of power consumption of the display panel and being adverse to environment protection.

SUMMARY OF THE INVENTION

An object of the present invention is to provide a color filter substrate, which compared to a conventional color filter substrate, has a reduced thickness and also provides relatively high color purity, light transmission rate, and pixel density.

Another object of the present invention is to provide a display device that comprises the above color filter substrate and possesses advantages of wide gamut, reduced thickness, and high brightness.

To achieve the above objects, firstly, the present invention provides a color filter substrate, which comprises a backing plate, a black matrix arranged on the backing plate, and a plurality of color resist blocks arranged on the backing plate and spaced from each other by the black matrix, wherein the color resist blocks comprises a multiple-pore support layer and a color resist material distributed in the multiple-pore support layer; the color resist material comprises pigment molecules; and the multiple-pore support layer comprises a plurality of pores formed therein such that the pores have a size that is greater than a size of the pigment molecules.

The multiple-pore support layer comprises a base and a plurality of blocking walls arranged on the base, the plurality of blocking walls defining and circumferentially surrounding a plurality of cavities in the base, the plurality of cavities serving as the plurality of pores of the multiple-pore support layer, the cavities having a size greater than the size of the pigment molecules.

The base and the plurality of blocking walls are formed of materials that comprise a metal material or an organic material.

The cavities are of a form of a rectangular parallelepiped and the cavities have a length and a width that are 50-500 nm and a depth that is 100-1000 nm.

The multiple-pore support layer comprises a plurality of graphene layers that is arranged perpendicular to the backing plate and spaced from each other, the plurality of graphene layers defining therebetween a plurality of divided hollow areas that serves as the plurality of pores of the multiple-pore support layer, the divided areas having a size greater than the size of the pigment molecules.

The divided areas have a width of 50-500 nm and a length of 50-1000 nm and the graphene layers has a height of 100-1000 nm.

The multiple-pore support layer comprises a plurality of carbon nanotubes that is arranged perpendicular to the backing plate, the plurality of carbon nanotubes being arranged on the backing plate in such a manner as to define and circumferentially surround a plurality of divided hollow spaces, the plurality of divided spaces serving as the plurality of pores of the multiple-pore support layer, the divided spaces having a size greater than the size of the pigment molecules.

The carbon nanotubes are each a single-wall carbon nanotube or a multiple-wall carbon nanotube.

The divided spaces are of a shape of a rectangular parallelepiped and the divided spaces have a length and a width that are 50-500 nm and a height that is 100-1000 nm.

The present invention also provides a display device, which comprises the above-described color filter substrate.

A color filter substrate comprises a backing plate, a black matrix arranged on the backing plate, and a plurality of color resist blocks arranged on the backing plate and spaced from each other by the black matrix, wherein the color resist blocks comprises a multiple-pore support layer and a color resist material distributed in the multiple-pore support layer; the color resist material comprises pigment molecules; and the multiple-pore support layer comprises a plurality of pores formed therein such that the pores have a size that is greater than a size of the pigment molecules;

wherein the multiple-pore support layer comprises a base and a plurality of blocking walls arranged on the base, the plurality of blocking walls defining and circumferentially surrounding a plurality of cavities in the base, the plurality of cavities serving as the plurality of pores of the multiple-pore support layer, the cavities having a size greater than the size of the pigment molecules;

wherein the base and the plurality of blocking walls are formed of materials that comprise a metal material or an organic material; and wherein the cavities are of a form of a rectangular parallelepiped and the cavities have a length and a width that are 50-500 nm and a depth that is 100-1000 nm.

The efficacy of the present invention is that the present invention provides a color filter substrate and a display device. The color filter substrate of the present invention comprises color resist blocks that comprise a multiple-pore support layer and a color resist material distributed in the multiple-pore support layer. The multiple-pore support layer provides effective dispersion and support of pigment molecules, allowing for reducing the amount of non-pigment constituents, such as a dispersion agent and resin, of the color resist material and increasing the content of pigment constituent to thereby improve the performance of light filtration for each unit film thickness of the color resist blocks and allow for thinning of the color filter substrate and an increased density of pixels. The display device of the present invention comprises the above-described color filter substrate and shows various advantages, including wide gamut, reduced thickness, and increased brightness.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawing.

DETAILED DESCRIPTION OF THE PREFERRED EMBODIMENTS

To further expound the technical solution adopted in the present invention and the advantages thereof, a detailed description is given to a preferred embodiment of the present invention with reference to the attached drawings.

Figure 1:
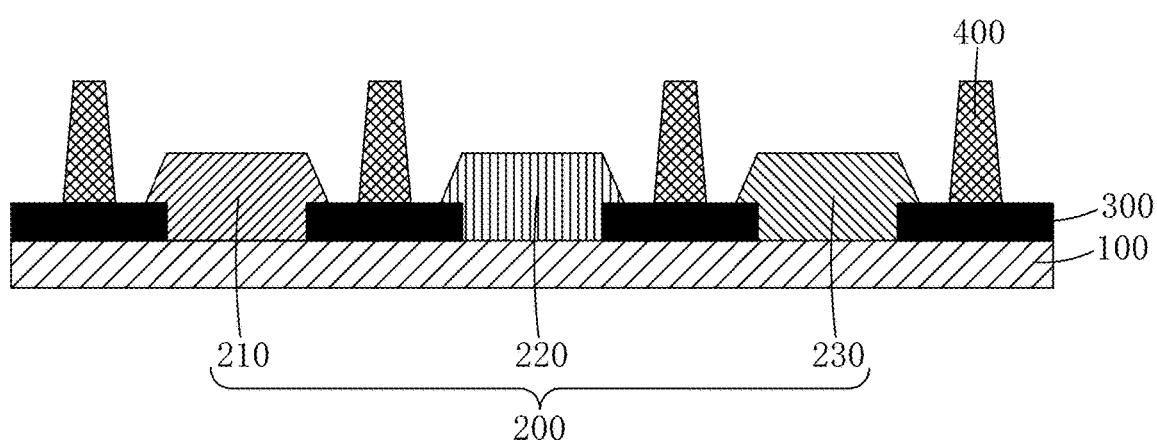
FIG. 1 is a schematic view illustrating the structure of a conventional color filter substrate.
Figure 2:
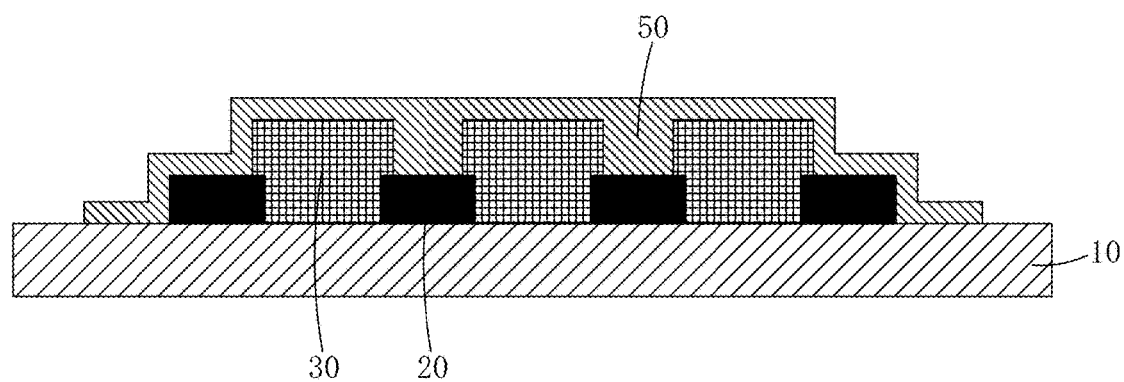
FIG. 2 is a schematic view illustrating the structure of a color filter substrate according to the present invention.
Figure 3:
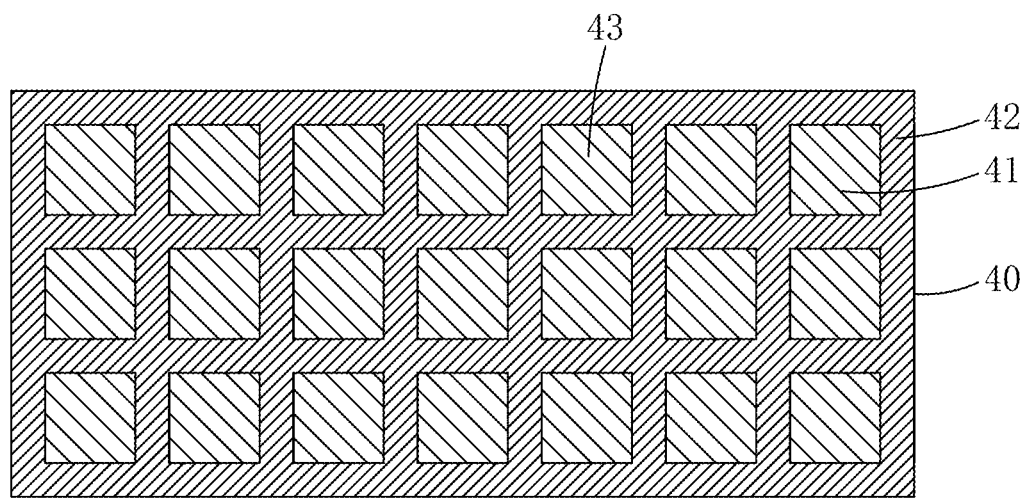
FIG. 3 is a schematic top plan view showing a first embodiment of a multiple-hole support layer of the color filter substrate according to the present invention.
Figure 4:
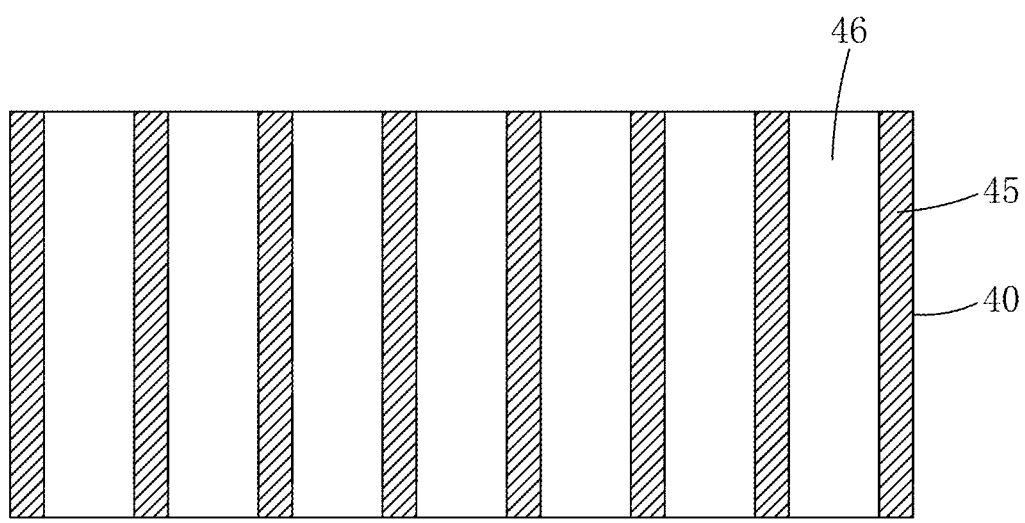
FIG. 4 is a schematic top plan view showing a second embodiment of the multiple-hole support layer of the color filter substrate according to the present invention.
Figure 5:
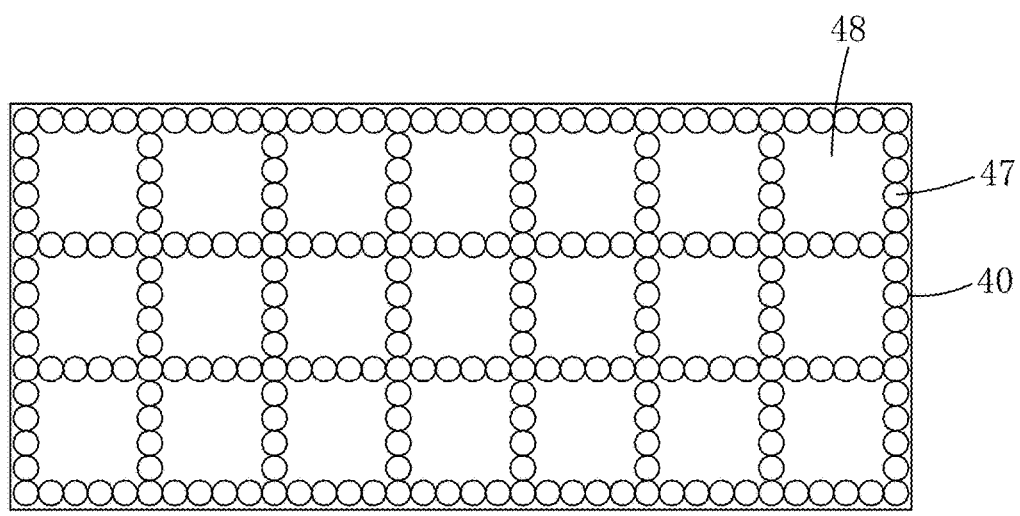
FIG. 5 is a schematic top plan view showing a third embodiment of the multiple-hole support layer of the color filter substrate according to the present invention.

Referring to FIG. 2, in combination with FIGS. 3-5, the present invention provides a color filter substrate, which comprises a backing plate 10, a black matrix 20 arranged on the backing plate 10, and a plurality of color resist blocks 30 arranged on the backing plate 10 and spaced from each other by the black matrix 20. The color resist blocks 30 comprise a multiple-pore support layer 40 and a color resist material distributed in the multiple-pore support layer 40. The color resist material comprises pigment molecules. The multiple-pore support layer 40 comprises a plurality of pores formed therein such that the pores have a size that is slightly greater than a size of the pigment molecules.

In addition to the pigment molecules, the color resist material also comprises other constituents, including a dispersion agent and resin. The constituents of the dispersion agent and the resin are used for dispersing the pigment. The present invention uses the multiple-pore support layer 40 to disperse and support the color resist material so that the pigment molecules can be well dispersed in the plurality of pores of the multiple-pore support layer 40 to provide an improved effect of dispersion of the pigment molecules and thus, with the same color purity being ensured, the amount of non-pigment constituents, such as the dispersion agent and the resin, contained in the color resist material can be reduced and the content of the pigment is increased o thereby improve the performance of light filtration for unit film thickness of the color resist blocks 30. The multiple-pore support layer 40 has relatively low absorption of light and does not alter the state of polarization of light.

Specifically, the pigment molecules have a diameter of 30-200 nm.

As shown in FIG. 3, a first embodiment of the multiple-pore support layer 40 of the color filter substrate according to the present invention is illustrated. In the first embodiment, the multiple-pore support layer 40 comprises a base 41 and a plurality of blocking walls 42 arranged on the base 41. The plurality of blocking walls 42 defines and circumferentially surrounds a plurality of cavities 43 in the base 41. The plurality of cavities 43 serves as the plurality of pores of the multiple-pore support layer 40. The cavities 43 have a size that is greater than the size of the pigment molecules.

Specifically, the base 41 and the plurality of blocking walls 42 are formed of a material comprising a metal material or an organic material.

Preferably, the metal material comprises one or multiple ones of gold (Au), copper (Cu), and aluminum (Al).

Preferably, the organic material comprises poly(methyl methacrylate) (PMMA).

Specifically, the base 41 and the plurality of blocking walls 42 arranged on the base 41 are integrally formed by using a nanoimprint process.

Preferably, the cavities 43 have a shape that is a rectangular parallelepiped and length and width of the cavities 43 are 50-500 nm. The cavities 43 have a depth of 100-1000 nm.

Preferably, the base 41 has a thickness of 5-20 nm. By arranging the base 41 to have a reduced thickness, sufficient light transmission can be ensured for the multiple-pore support layer 40.

As shown in FIG. 4, a second embodiment of the multiple-pore support layer 40 of the color filter substrate according to the present invention is illustrated. In the second embodiment, the multiple-pore support layer 40 comprises a plurality of graphene layers 45 that is arranged perpendicular to the backing plate 10 and spaced from each other. The plurality of graphene layers 45 defines therebetween a plurality of divided hollow areas 46 that serves as the plurality of pores of the multiple-pore support layer 40. The divided areas 46 have a size that is greater than the size of the pigment molecules.

Specifically, the graphene layers 45 may each be a single layer of graphene or multiple layers of graphene. The single layer of graphene may have a thickness of around 0.335 nm, and the multiple layers of graphene may have a thickness of around 0.335-3.35 nm.

Preferably, the plurality of graphene layers 45 is arranged on the backing plate 10 in a manner of being substantially parallel to each other.

Specifically, the divided areas 46 have a width of 50-500 nm and a length of 50-1000 nm; and the graphene layers 45 have a height of 100-1000 nm.

As shown in FIG. 5, a third embodiment of the multiple-pore support layer 40 of the color filter substrate according to the present invention is illustrated. In the third embodiment, the multiple-pore support layer 40 comprises a plurality of carbon nanotubes 47 that is arranged perpendicular to the backing plate 10. The plurality of carbon nanotubes 47 is arranged on the backing plate 10 in such a manner as to define and circumferentially surround a plurality of divided hollow spaces 48. The plurality of divided spaces 48 serves as the plurality of pores of the multiple-pore support layer 40. The divided spaces 48 have a size that is greater than the size of the pigment molecules.

Specifically, the carbon nanotubes 47 can each be a single-wall carbon nanotube or a multiple-wall carbon nanotube. The single-wall carbon nanotubes have a diameter of 0.6-2 nm and the multiple-wall carbon nanotubes have a diameter of 2-100 nm.

Specifically, the divided spaces 48 may be of a shape that is a cylinder, a rectangular prism, or an irregular prism.

Preferably, the divided spaces 48 are of a shape of rectangular parallelepiped and the divided spaces 48 have a length and a width that are 50-500 nm and a height of 100-1000 nm.

Specifically, the plurality of color resist blocks 30 comprises a plurality of red resist blocks, a plurality of green resist blocks, and a plurality of blue resist blocks.

Preferably, the plurality of color resist blocks 30 has identical areas.

Preferably, the color filter substrate further comprises a planarization layer 50 arranged on the black matrix 20 and the plurality of color resist blocks 30. Specifically, the planarization layer 50 is formed of a material comprising a transparent organic material.

Specifically, the backing plate 10 is a transparent plate, preferably a glass plate.

Figure 6:
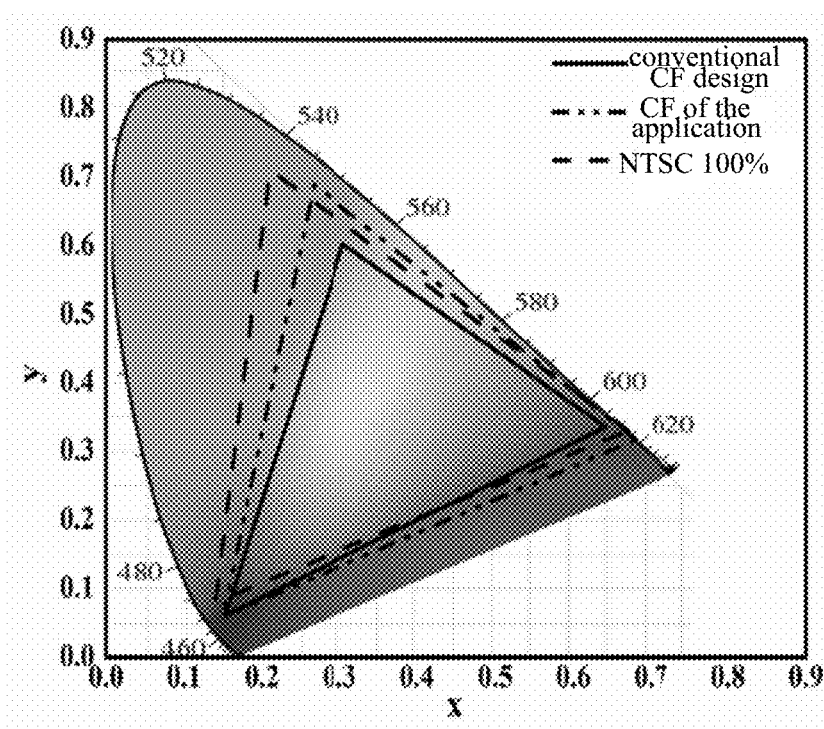
FIG. 6 is a schematic view showing a comparison of color gamut between the color filter substrate according to the present invention and the conventional color filter substrate.

The present invention provides a color filter substrate, which uses a multiple-pore support layer 40 to distribute a color resist material and the multiple-pore support layer 40 comprises a plurality of pores formed therein such that the pores have a size that is slightly greater than a size of pigment molecules to allow the pigment molecules to be well dispersed in the multiple-pore support layer 40. The multiple-pore support layer 40, due to providing an effect of dispersing the pigment molecules, take the place of at least a part of a dispersion agent and resin, so as to help reduce the amount of non-pigment constituents, including the dispersion agent and the resin, contained in a color resist material thereby increasing the content of the pigment constituent in the color resist material so that the thickness of color resist blocks 30 that provides the same color purity can be reduced and further, with the reduction of the thickness of the color resist blocks 30, the thickness of the black matrix 20 is also reduced to thereby facilitate thinning of the color filter substrate and also improve transmission rate of the color filter substrate, allowing a display device involving such a color filter substrate to show higher brightness. Under the condition that the thickness of the color resist blocks 30 maintains unchanged, then due to the content of pigment in the color resist material being relatively increased, widths of the color resist blocks 30 and the black matrix 20 can be reduced thereby allowing for an increased density of pixels. FIG. 6 is a schematic view illustrating comparison of color gamut between the color filter substrate of the present invention and a prior art color filter substrate. It can be seen from FIG. 6 that the color filter substrate of the present invention has a width gamut than the prior art color filter substrate.

Specifically, the present invention also provides a display device, which comprises the above-described color filter substrate. The display device shows various advantages, including wide gamut, reduced thickness, and increased brightness. Repeated description of the color filter substrate will be omitted herein.

In summary, the present invention provides a color filter substrate and a display device. The color filter substrate of the present invention comprises color resist blocks that comprise a multiple-pore support layer and a color resist material distributed in the multiple-pore support layer. The multiple-pore support layer provides effective dispersion and support of pigment molecules, allowing for reducing the amount of non-pigment constituents, such as a dispersion agent and resin, of the color resist material and increasing the content of pigment constituent to thereby improve the performance of light filtration for each unit film thickness of the color resist blocks and allow for thinning of the color filter substrate and an increased density of pixels. The display device of the present invention comprises the above-described color filter substrate and shows various advantages, including wide gamut, reduced thickness, and increased brightness.

Based on the description given above, those having ordinary skills of the art may easily contemplate various changes and modifications of the technical solution and technical ideas of the present invention and all these changes and modifications are considered within the protection scope of right for the present invention as defined in the appended claims.

What is claimed is:

1. A color filter substrate, comprising a backing plate, a black matrix arranged on the backing plate, and a plurality of color resist blocks arranged on the backing plate and spaced from each other by the black matrix, wherein the color resist blocks comprises a multiple-pore support layer and a color resist material distributed in the multiple-pore support layer; the color resist material comprises pigment molecules; and the multiple-pore support layer comprises a plurality of pores formed therein such that the pores have a size that is greater than a size of the pigment molecules;

wherein the multiple-pore support layer comprises a plurality of graphene layers that is arranged perpendicular to the backing plate and spaced from each other, the plurality of graphene layers defining therebetween a plurality of divided hollow areas that serves as the plurality of pores of the multiple-pore support layer, the divided areas having a size greater than the size of the pigment molecules.

2. The color filter substrate as claimed in claim 1, wherein the divided areas have a width of 50-500 nm and a length of 50-1000 nm and the graphene layers has a height of 100-1000 nm.

3. A display device, comprising a color filter substrate as claimed in claim 1.

4. A color filter substrate, comprising a backing plate, a black matrix arranged on the backing plate, and a plurality of color resist blocks arranged on the backing plate and spaced from each other by the black matrix, wherein the color resist blocks comprises a multiple-pore support layer and a color resist material distributed in the multiple-pore support layer; the color resist material comprises pigment molecules; and the multiple-pore support layer comprises a plurality of pores formed therein such that the pores have a size that is greater than a size of the pigment molecules;

wherein the multiple-pore support layer comprises a plurality of carbon nanotubes that is arranged perpendicular to the backing plate, the plurality of carbon nanotubes being arranged on the backing plate in such a manner as to define and circumferentially surround a plurality of divided hollow spaces, the plurality of divided spaces serving as the plurality of pores of the multiple-pore support layer, the divided spaces having a size greater than the size of the pigment molecules.

5. The color filter substrate as claimed in claim 4, wherein the carbon nanotubes are each a single-wall carbon nanotube or a multiple-wall carbon nanotube.

6. The color filter substrate as claimed in claim 4, wherein the divided spaces are of a shape of a rectangular parallelepiped and the divided spaces have a length and a width that are 50-500 nm and a height that is 100-1000 nm.

\* \* \* \* \*